US010141221B1

(12) United States Patent
Lai et al.

(10) Patent No.: US 10,141,221 B1
(45) Date of Patent: Nov. 27, 2018

(54) METHOD FOR MANUFACTURING THREE DIMENSIONAL STACKED SEMICONDUCTOR STRUCTURE AND STRUCTURE MANUFACTURED BY THE SAME

(71) Applicant: MACRONIX INTERNATIONAL CO., LTD., Hsinchu (TW)

(72) Inventors: Erh-Kun Lai, Taichung (TW); Hsiang-Lan Lung, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/652,325

(22) Filed: Jul. 18, 2017

(51) Int. Cl.
| | |
|---|---|
| H01L 21/768 | (2006.01) |
| H01L 21/3213 | (2006.01) |
| H01L 21/3205 | (2006.01) |
| H01L 27/11582 | (2017.01) |
| H01L 21/311 | (2006.01) |

(52) U.S. Cl.
CPC .... H01L 21/7682 (2013.01); H01L 21/31111 (2013.01); H01L 21/32055 (2013.01); H01L 21/32134 (2013.01); H01L 21/76831 (2013.01); H01L 21/76843 (2013.01); H01L 21/76877 (2013.01); H01L 27/11582 (2013.01)

(58) Field of Classification Search
CPC .......... H01L 21/7682; H01L 21/31111; H01L 21/32055; H01L 21/32134; H01L 21/76831; H01L 21/76843; H01L 21/76877; H01L 27/11551; H01L 27/1157; H01L 27/11578; H01L 27/11582
See application file for complete search history.

(56) References Cited

U.S. PATENT DOCUMENTS

| | | | |
|---|---|---|---|
| 8,658,499 B2 * | 2/2014 | Makala | H01L 21/28273 257/314 |
| 9,019,739 B2 * | 4/2015 | Park | G11C 5/025 365/51 |
| 9,093,321 B2 * | 7/2015 | Makala | H01L 21/28273 |
| 9,183,916 B2 * | 11/2015 | King Liu | H01L 27/1021 |
| 9,362,302 B1 * | 6/2016 | Lai | H01L 27/11582 |

(Continued)

OTHER PUBLICATIONS

TIPO Office Action dated Oct. 17, 2017 in Taiwan application (No. 106125625).

(Continued)

*Primary Examiner* — Earl N Taylor
(74) *Attorney, Agent, or Firm* — McClure, Qualey & Rodack, LLP (57) ABSTRACT

A method of manufacturing a three-dimensional (3D) stacked semiconductor structure is provided. A multi-layered stack is formed above a substrate, and the multi-layered stack comprises a plurality of nitride layers and polysilicon layers arranged alternately. Several channel holes are formed vertically to the substrate. The multi-layered stack is patterned to form linear spaces between the channel holes, wherein the linear spaces extend downwardly for being vertical to the substrate and to expose sidewalls of the nitride layers and the polysilicon layers. Then, the polysilicon layers are replaced with insulating layers having air-gaps through the linear spaces, and the nitride layers are replaced with conductive layers through the linear spaces.

20 Claims, 9 Drawing Sheets

(56) References Cited

U.S. PATENT DOCUMENTS

| | | | | |
|---|---|---|---|---|
| 9,397,110 B2* | 7/2016 | Lue | | H01L 27/1157 |
| 9,412,752 B1* | 8/2016 | Yeh | | H01L 27/11565 |
| 9,431,416 B2* | 8/2016 | Nam | | H01L 27/11582 |
| 9,613,981 B2* | 4/2017 | Huo | | H01L 27/11582 |
| 9,691,884 B2* | 6/2017 | Makala | | H01L 27/11524 |
| 9,754,953 B2* | 9/2017 | Tang | | H01L 27/11556 |
| 9,853,132 B2* | 12/2017 | Cheng | | H01L 29/6681 |
| 9,899,412 B2* | 2/2018 | Lee | | H01L 27/11582 |
| 2010/0320528 A1* | 12/2010 | Jeong | | H01L 27/105 |
| | | | | 257/324 |
| 2011/0309430 A1* | 12/2011 | Purayath | | H01L 21/28273 |
| | | | | 257/321 |
| 2012/0052674 A1* | 3/2012 | Lee | | H01L 27/11578 |
| | | | | 438/591 |
| 2012/0092926 A1* | 4/2012 | Whang | | H01L 27/11556 |
| | | | | 365/185.01 |
| 2012/0104484 A1* | 5/2012 | Lee | | H01L 27/11582 |
| | | | | 257/324 |
| 2012/0146122 A1* | 6/2012 | Whang | | H01L 29/7889 |
| | | | | 257/315 |
| 2012/0299086 A1* | 11/2012 | Lee | | H01L 27/1157 |
| | | | | 257/324 |
| 2012/0329224 A1* | 12/2012 | Kong | | H01L 21/0332 |
| | | | | 438/268 |
| 2013/0009236 A1* | 1/2013 | Lee | | H01L 27/11556 |
| | | | | 257/329 |
| 2013/0062681 A1 | 3/2013 | Fujiki et al. | | |
| 2013/0148398 A1 | 6/2013 | Baek et al. | | |
| 2013/0341701 A1* | 12/2013 | Blomme | | H01L 21/764 |
| | | | | 257/324 |
| 2014/0138760 A1* | 5/2014 | Makala | | H01L 21/28273 |
| | | | | 257/321 |
| 2014/0264525 A1* | 9/2014 | Takahashi | | H01L 27/115 |
| | | | | 257/314 |
| 2015/0008499 A1* | 1/2015 | Lee | | H01L 27/11273 |
| | | | | 257/314 |
| 2015/0069494 A1* | 3/2015 | Makala | | H01L 21/28273 |
| | | | | 257/321 |
| 2015/0179661 A1* | 6/2015 | Huo | | H01L 21/764 |
| | | | | 257/57 |
| 2015/0249143 A1* | 9/2015 | Sano | | H01L 29/66666 |
| | | | | 257/66 |
| 2015/0340369 A1* | 11/2015 | Lue | | H01L 29/42392 |
| | | | | 365/185.03 |
| 2015/0340371 A1* | 11/2015 | Lue | | H01L 21/28282 |
| | | | | 257/324 |
| 2016/0035789 A1* | 2/2016 | Mine | | H01L 27/101 |
| | | | | 365/148 |
| 2016/0086972 A1* | 3/2016 | Zhang | | H01L 27/11582 |
| | | | | 257/66 |
| 2016/0322382 A1* | 11/2016 | Lee | | H01L 27/11582 |
| 2017/0194347 A1* | 7/2017 | Lee | | H01L 27/11582 |

OTHER PUBLICATIONS

Fukuzumi, et al.: "Optimal Integration and Characteristics of Vertical Array Devices for Ultra-High Density, Bit-Cost Scalable Flash Memory"; 1-4244-0439-X/07/$25.00 © 2007 IEEE; pp. 449-452.

Jang, et al.: "Vertical Cell Array using TCAT(Terabit Cell Array Transistor) Technology for Ultra High Density NAND Flash Memory"; 2009 Symposium on VLSI Technology Digest of Technical Papers; pp. 192-193.

TIPO Office Action dated Aug. 20, 2018 in Taiwan application (No. 106125625).

* cited by examiner

METHOD FOR MANUFACTURING THREE DIMENSIONAL STACKED SEMICONDUCTOR STRUCTURE AND STRUCTURE MANUFACTURED BY THE SAME

BACKGROUND

Field of the Invention

The disclosure relates in general to a method of manufacturing a three-dimensional (3D) stacked semiconductor structure and a 3D stacked semiconductor structure manufactured by the same, and more particularly to a method for manufacturing the structure having air-gaps in the insulating layers.

Description of the Related Art

A nonvolatile semiconductor memory device is typically designed to securely hold data even when power is lost or removed from the memory device. Various types of nonvolatile memory devices have been proposed in the related art. Also, manufactures have been looking for new developments or techniques combination for stacking multiple planes of memory cells, so as to achieve greater storage capacity. For example, several types of multi-layer stackable NAND-type flash memory structures have been proposed. However, the typical 3D semiconductor structure suffers from several problems.

For example, the capacitance between the conductive layers of adjacent stacking layers in an array area of a 3D semiconductor structure is too high, and it is getting worse when a larger number of the stacking layers and/or larger array area are/is required. Also, the conventional 3D stacked semiconductor structure and manufacturing method suffers from bending or collapsed problems when a larger number of the stacking layers are required.

SUMMARY

The disclosure relates to a method of manufacturing a three-dimensional (3D) stacked semiconductor structure and a structure manufactured by the same. According to the disclosure, the insulating layers are arranged alternately with the conductive layers haves air-gaps inside, so that the weight of the 3D stacked semiconductor structure can be reduced, and the capacitance between the conductive layers can be decreased.

According to one embodiment of the present disclosure, a method of manufacturing a three-dimensional (3D) stacked semiconductor structure is provided, comprising: forming a multi-layered stack above a substrate, and the multi-layered stack comprising a plurality of nitride layers and polysilicon layers arranged alternately; forming a plurality of channel holes vertically to the substrate; patterning the multi-layered stack to form linear spaces between the channel holes and vertical to the substrate, wherein the linear spaces extend downwardly to expose sidewalls of the nitride layers and the polysilicon layers; replacing the polysilicon layers with insulating layers having air-gaps through the linear spaces; and replacing the nitride layers with conductive layers through the linear spaces.

According to one embodiment of the present disclosure, a three-dimensional (3D) stacked semiconductor structure is provided, comprising: a substrate, having an array area and a peripheral area; and a patterned multi-layered stack formed above a substrate in the array area. The patterned multi-layered stack comprises: a plurality of insulating layers having air-gaps; a plurality of conductive layers, and a plurality of channel holes vertically to the substrate, wherein the insulating layers and the conductive layers are arranged alternately, and the channel holes extend downwardly for penetrating the insulating layers and the conductive layers.

The disclosure will become apparent from the following detailed description of the preferred but non-limiting embodiments. The following description is made with reference to the accompanying drawings.

BRIEF DESCRIPTION OF THE DRAWINGS

FIG. 1-FIG. 8B illustrate a method for manufacturing a 3D stacked semiconductor structure according to an embodiment of the present disclosure.

DETAILED DESCRIPTION

In the embodiments of the present disclosure, a method of manufacturing a three-dimensional (3D) stacked semiconductor structure and a structure manufactured by the same are provided. According to the method of the embodiment, a patterned multi-layered stack comprising plural insulating layers having air-gaps and plural conductive layers arranged alternately can be formed above a substrate in an array area of a 3D stacked semiconductor structure. The method as disclosed in the embodiment reduces the weight of a 3D stacked semiconductor structure as manufactured, so that the configuration at the channel hole (ex: comprising the ONO layer and the poly channel layer) functioning as a supporting pillar can sustain more stacking layers during fabrication of a 3D stacked semiconductor structure. Also, the capacitance between the conductive layers (WLs) can be reduced due to the existence of the air-gaps in the insulating layers. Moreover, the method of the embodiment causes no damage to the related layers and components of the structure. The method of the embodiment is especially suitable for manufacturing the 3D stacked semiconductor structure with large number of the stacking layers, and the structure of the embodiments possesses a solid construction (due to the reduced weight of the insulating layers and less loading of the supporting pillar), a complete profile of the related layers and components, and improved and reliable electrical characteristics.

The embodiment of the present disclosure could be implemented in many different 3D stacked semiconductor structures in the applications. For example, the embodiment could be applied to, but not limited to, the 3D vertical-channel (VC) semiconductor devices. The embodiments are provided hereinafter with reference to the accompanying drawings for elaborating the method of manufacturing the 3D stacked semiconductor structure of the disclosure and the structure manufactured by the same. However, the present disclosure is not limited thereto. The descriptions disclosed in the embodiments of the disclosure such as detailed structures, manufacturing procedures and material selections are for illustration only, not for limiting the scope of protection of the disclosure.

Also, it is noted that not all embodiments of the invention are shown. Modifications and variations can be made without departing from the spirit of the disclosure to meet the requirements of the practical applications. Thus, there may be other embodiments of the present disclosure which are not specifically illustrated. It is also important to point out that the illustrations may not be necessarily be drawn to scale. Thus, the specification and the drawings are to be regard as an illustrative sense rather than a restrictive sense.

Moreover, use of ordinal terms such as "first", "second", "third" etc., in the specification and claims to describe an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

Figure 1:
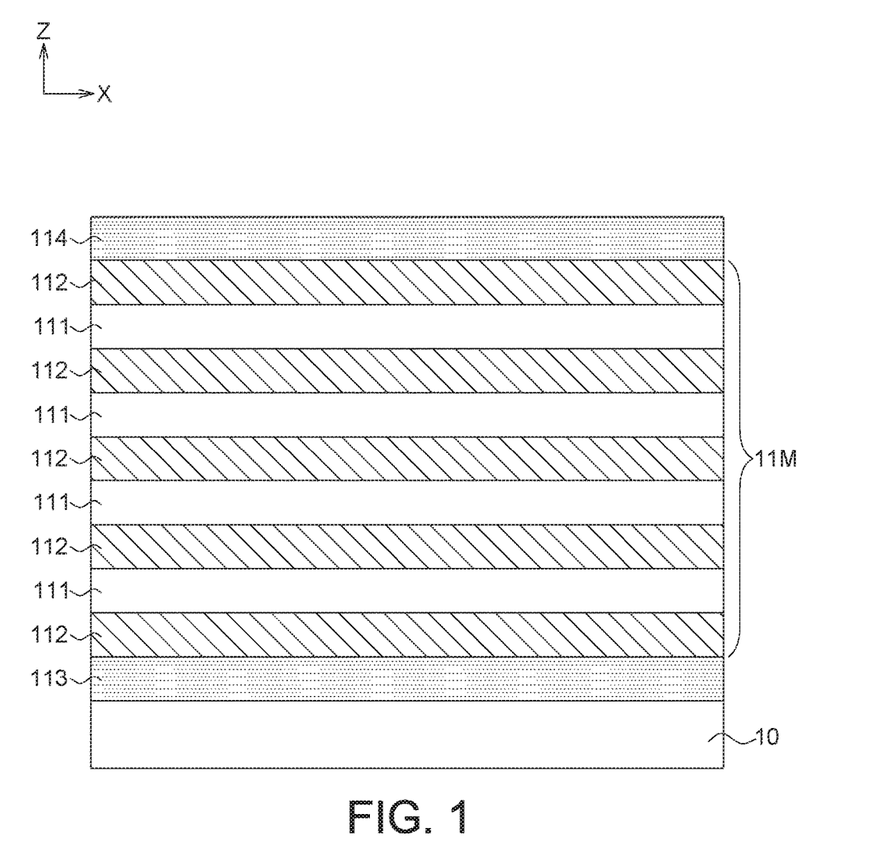

FIG. 1-FIG. 8B illustrate a method for manufacturing a 3D stacked semiconductor structure according to an embodiment of the present disclosure. As shown in FIG. 1, a multi-layered stack 11M is formed above a substrate 10, and the multi-layered stack 11M comprises a plurality of first dummy layers (such as the nitride layers 111) and a plurality of second dummy layers (such as the polysilicon layers 112) arranged alternately along a direction (ex: Z-direction) vertical to the substrate 10. In one embodiment, the nitride layers 111 as the first dummy layers could be silicon nitride, and the polysilicon layers 112 as the second dummy layers could be heavily doped N+ polysilicon layers or heavily doped P+ polysilicon layers. In one embodiment, the second dummy layers of the multi-layered stack 11M are heavily doped N+ polysilicon layers, if the second dummy layers are removed by tetra-methyl ammonium hydroxide (TMAH) dipping subsequently (i.e. N+ polysilicon would be etched more quickly than P+ polysilicon in the TMAH etchant).

Also, in one embodiment, the structure further comprises a bottom oxide layer 113 and a top oxide layer 114, wherein the bottom oxide layer 113 is formed on the substrate 10, the multi-layered stack 11M is formed on the bottom oxide layer 113, and the top oxide layer 114 (as a hard mask (HM)) is deposited on the multi-layered stack 11M, as shown in FIG. 1.

Figure 2:
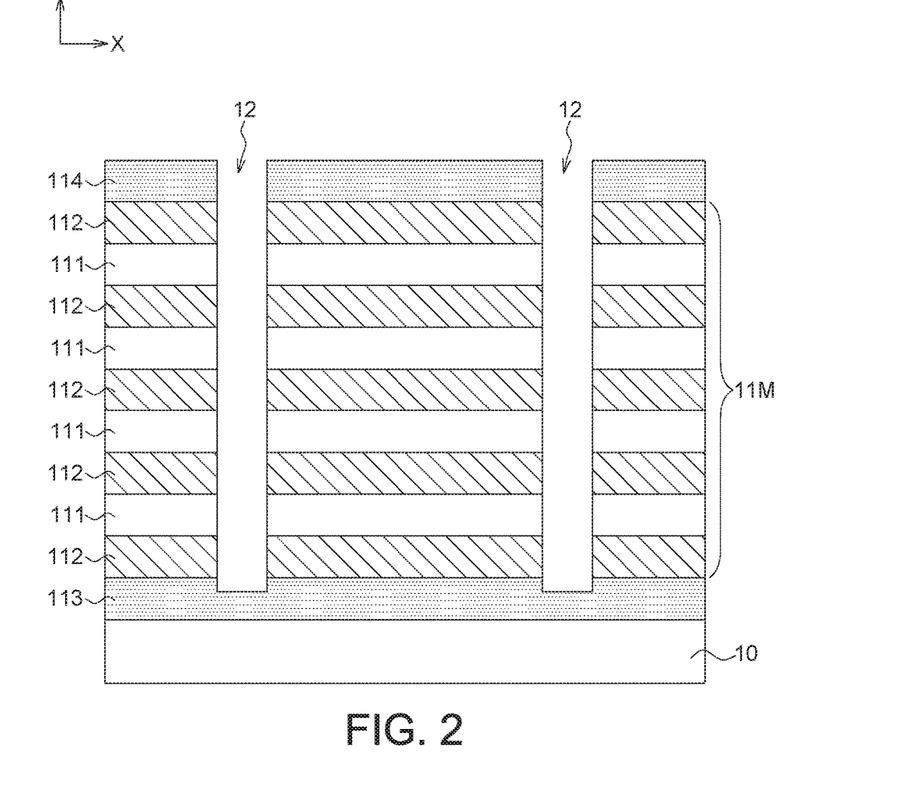

Then, several holes 12 vertically to the substrate 10 are formed such as by etching. As shown in FIG. 2, the holes 12 penetrate the top oxide layer 114, the multi-layered stack 11M and the bottom oxide layer 113. The holes 12 stop on the bottom oxide layer 113, and expose the sidewalls of the nitride layers 111 and the sidewalls of the polysilicon layers 112.

Figure 3:
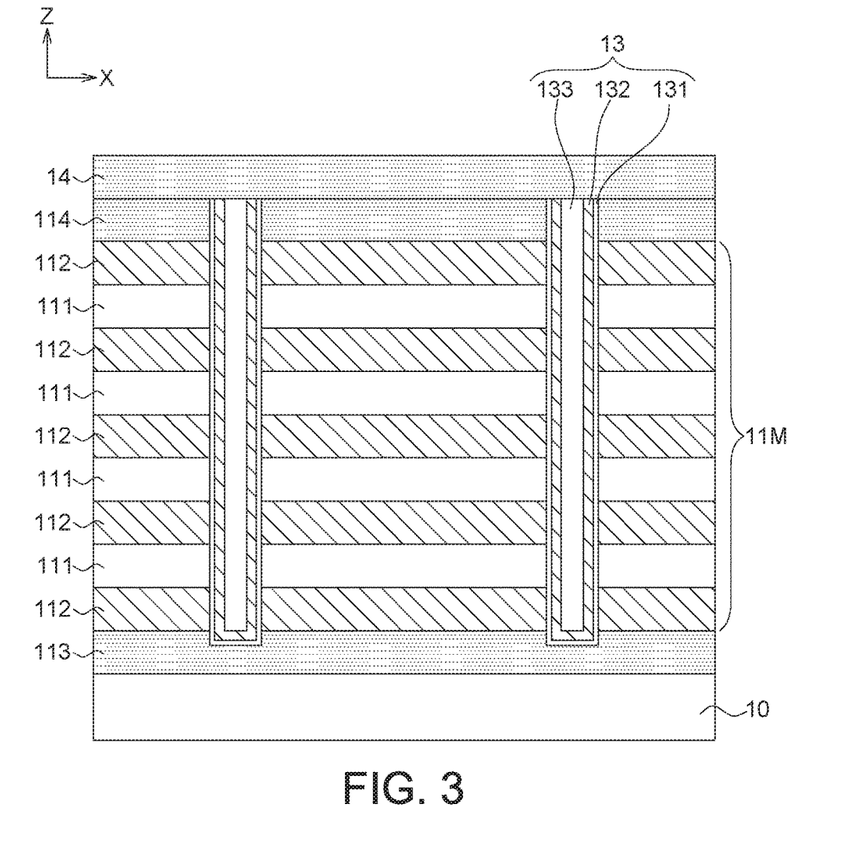

Afterward, the channel holes 13 vertically to the substrate 10 are formed. In one embodiment, each of the channel holes 13 comprises a charge trapping layer 131 (functioning as a memory layer) as a liner of the hole 12, a polysilicon channel layer 132 (ex: undoped polysilicon) deposited along the charge trapping layer 131 (the polysilicon channel layer 132 configured as a poly-liner), and a dielectric medium layer 133 filling up the rest space inside the hole 12, as shown in FIG. 3. The dielectric medium layer 133 can be oxide layer or air. Also, in one embodiment, the charge trapping layer 131 functioning as a memory layer could be an ONO layer or an ONONO layer or an ONONONO layer. For example, the charge trapping layer 131 may comprise a blocking oxide layer (adjacent to the sidewalls of the nitride layers 111 and the sidewalls of the polysilicon layers 112), a trapping nitride layer and a tunneling oxide layer (adjacent to the polysilicon channel layer 132). In the exemplified drawings of the embodiment, a macaroni-type channel configuration (i.e. the polysilicon is partially filled as a channel layer in the channel hole 13) is provided for illustration. However, the disclosure is not limited thereto, and the polysilicon can be fully fills the channel hole as a channel layer for meeting the requirements of the practical application. The disclosure is not limited to one particular kind.

Also, a cap oxide layer 14 is formed on the top oxide layer 114 and covers the channel holes 13 to protect the poly channels, as shown in FIG. 3. In some embodiments, the hole 12 is etched and stopped on the substrate 10. The polysilicon channel layer 132 is etched to form a spacer and the polysilicon channel layer 132 is short to the substrate 10. The varied configurations of these embodiments are also applicable in this disclosure.

Figure 4A:
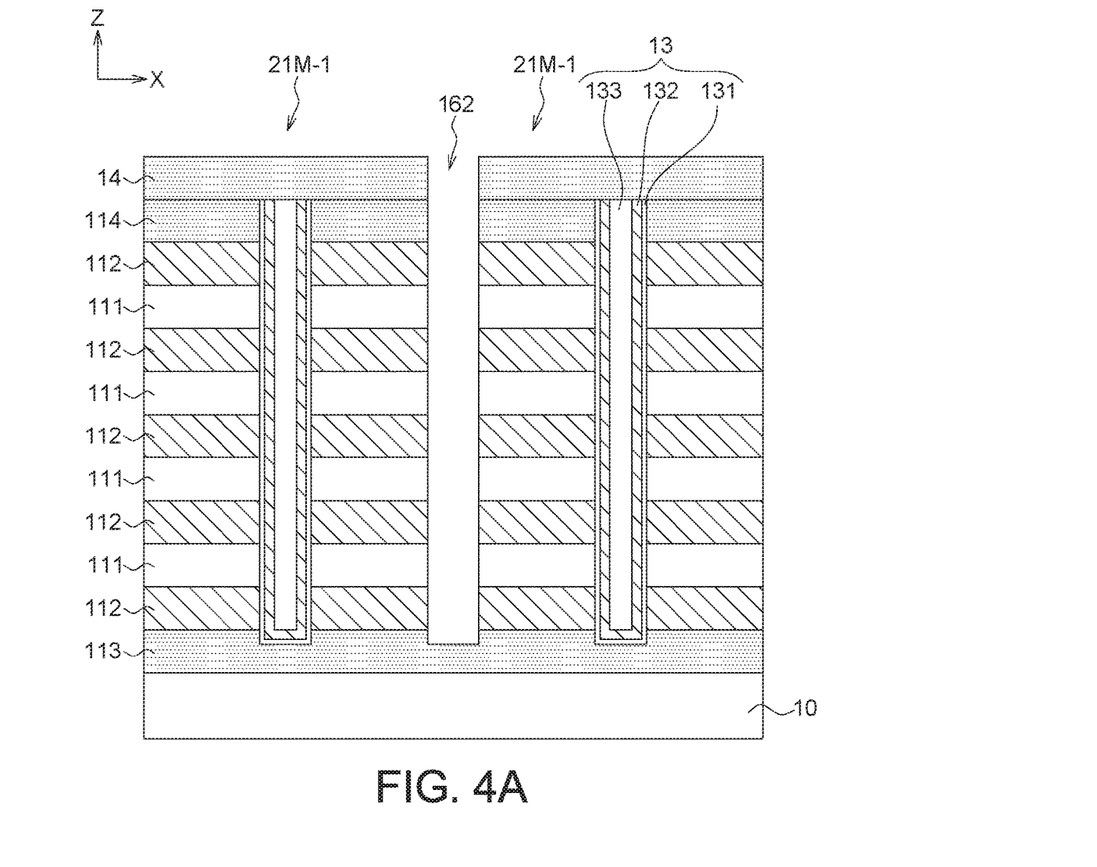
Figure 4B:
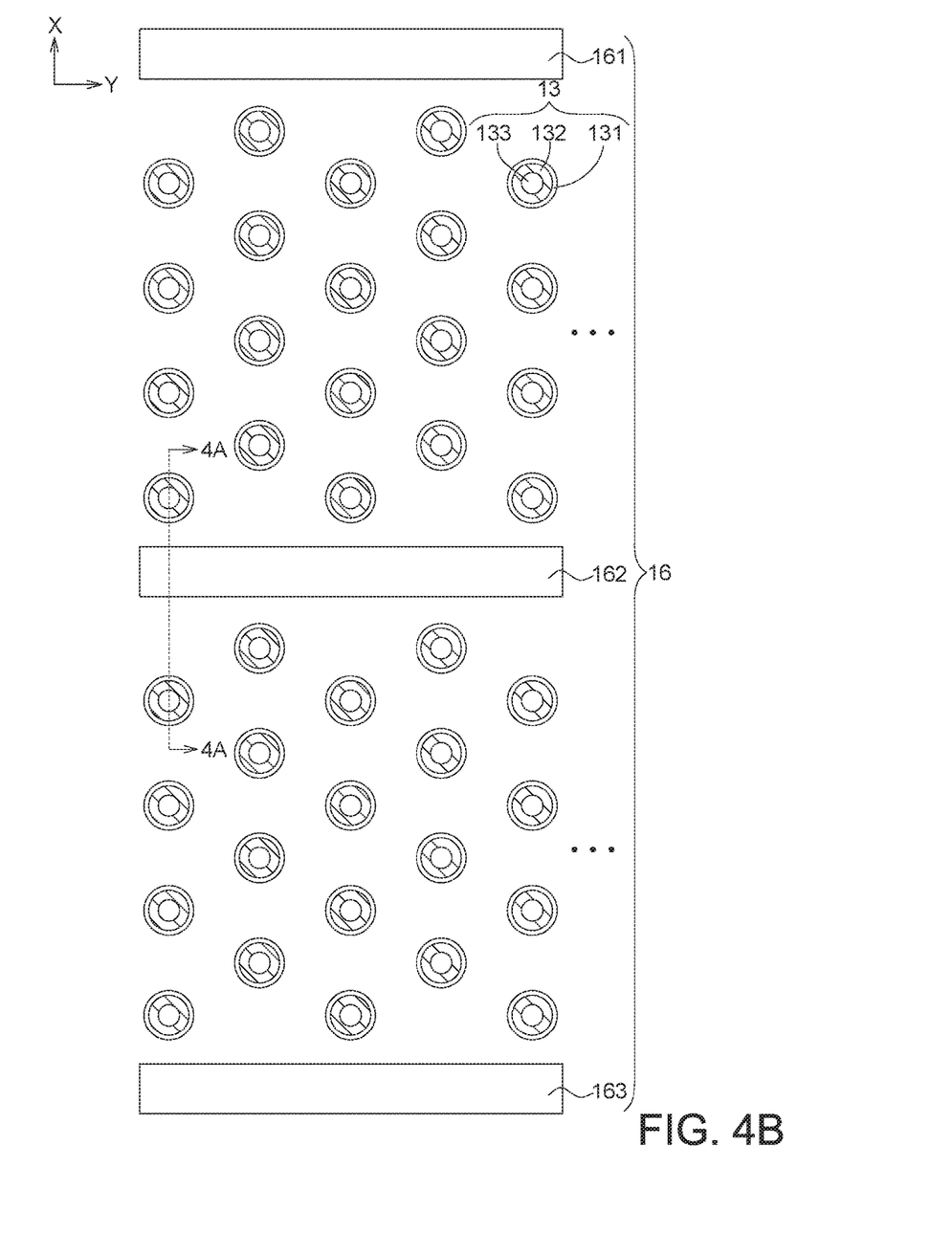

Please refer to FIG. 4A and FIG. 4B. FIG. 4A is a cross-sectional view of the structure along the cross-sectional line 4A-4A of FIG. 4B according to one embodiment of the disclosure. FIG. 4B demonstrates a top view of one applicable arrangement of the channel holes 13 and a line pattern 16 according to one embodiment of the disclosure. It is noted that the disclosure is not limited to the -honeycomb arrangement of the channel holes as shown in FIG. 4B.

As shown in FIG. 4A and FIG. 4B, after forming the channel holes 13 and the cap oxide layer 14, the multi-layered stack 11M is patterned to form a line pattern 16 and several patterned multi-layered stacks 21M-1. The line pattern 16 facilitates material replacement procedures conducted subsequently. In one embodiment, the line pattern 16 comprises several linear spaces (such as 161, 162, 163 in FIG. 4B) between the channel holes 13, and the linear spaces are vertical to the substrate 10 (i.e. extends along the Z-direction), as shown in FIG. 4A. In FIG. 4A, the linear space (such as 162) extend downwardly to expose the sidewalls of the nitride layers 111 and the sidewalls of the polysilicon layers 112. Also, in one embodiment, the vertical-extending direction (ex: along the Z-direction) of the linear spaces (such as the linear space 162 in FIG. 4A) is parallel to the vertical-extending direction of the channel holes 13 (ex: along Z-direction).

In one embodiment, a line pattern 16 defines several patterned multi-layered stacks 21M-1 (as shown in FIG. 4A), and each of the patterned multi-layered stacks 21M-1 includes several channel holes 13 between two adjacent linear spaces such as between the linear spaces 161 and 162 (as shown in FIG. 4B). In one embodiment, each of the patterned multi-layered stacks 21M-1 includes 4 channel holes 13 or 8 channel holes 13 between two adjacent linear spaces, depending on the practical condition of the applications.

Next, material replacement procedures through the line pattern 16 are performed for replacing the dummy layers in the patterned multi-layered stacks. For example, the polysilicon layers 112 are replaced with the insulating layers (ex: oxide layer) having air-gaps through the linear spaces of the line pattern 16; and the nitride layers 111 are replaced with the conductive layers (ex: comprising metal layers) through the linear spaces of the line pattern 16.

Figure 5:
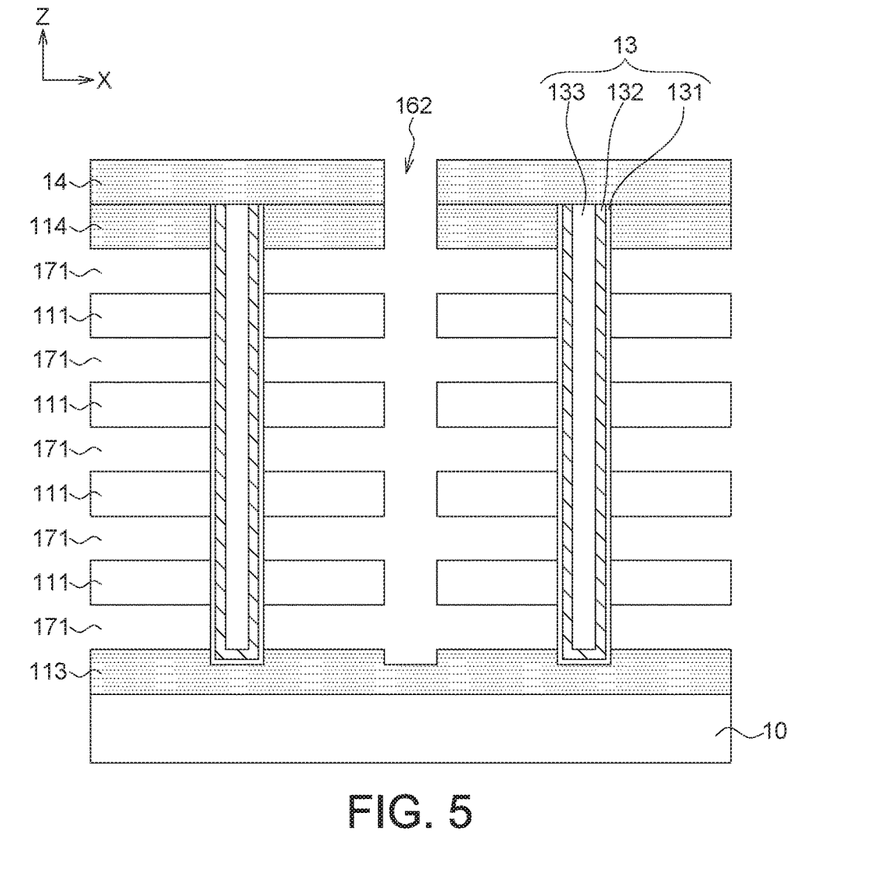

As shown in FIG. 5, removal of the polysilicon layers 112 is performed. The polysilicon layers 112 can be removed by dry etching or wet etching. In one embodiment, the polysilicon layers 112 are removed by tetra-methyl ammonium hydroxide (TMAH) dipping (i.e. using a TMAH solution as an etchant in wet etching). TMAH has very high selectivity to oxide and nitride. During TMAH dipping, the TMAH solution only etches polysilicon and it will not damage top oxide of ONO or ONONO or ONONONO layer (i.e. the charge trapping layer 131), thereby keeping good gate oxide integrity (GOI) of the ONO or ONONO or ONONONO layer. After completely removing the polysilicon layers 112, the first cavities 171 are formed, wherein the nitride layers (ex: SiN) 111 are remained in the structure, as shown in FIG. 5.

Figure 6A:
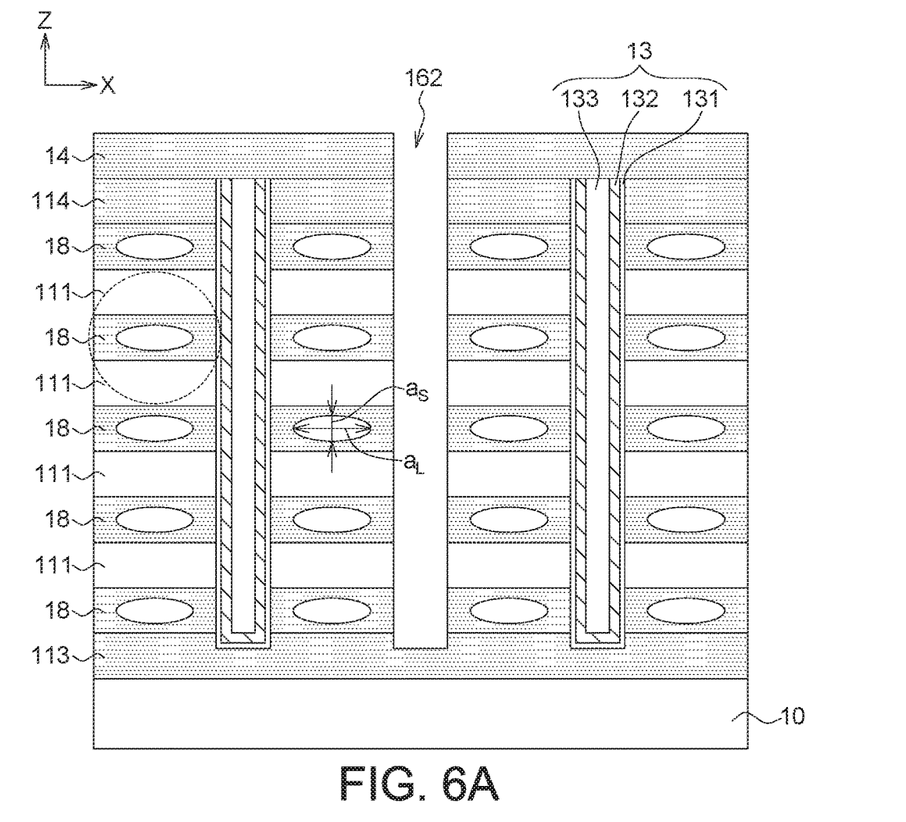
Figure 6B:
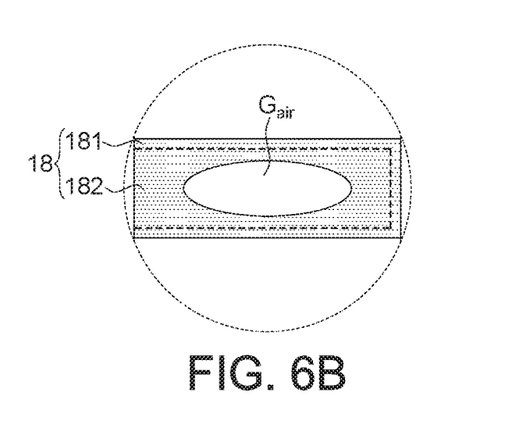

Then, as shown in FIG. 6A, several oxide layers 18 having air-gaps $G_{air}$ are formed in the first cavities 171 as the insulating layers for replacing the polysilicon layers 112. The air-gaps $G_{air}$ encapsulated in the oxide layers 18 can be formed by at least two-step depositions. FIG. 6B is an enlarging view of an oxide layer 18 in one of the first cavities of FIG. 6A according to one embodiment of the disclosure. In one embodiment, deposition of the oxide layers 18 comprises (1) conformally depositing the first oxide portions 181 (FIG. 6B) in the first cavities 171 (i.e. each of the first oxide portions 181 in the corresponding first cavity 171 is formed as an oxide liner); and (2) non-conformally depositing the second oxide portions 182 (along the first oxide portions 181) in the of first cavities 171 for generating the air-gaps $G_{air}$ encapsulated in the oxide layers 18. In other words, the air-gap $G_{air}$ in the first cavity 171 correspondingly is encapsulated by the first oxide portion 181 and the second oxide portion 182.

Also, a non-conformally etching step is preformed to remove (ex: by dry etching or wet etching) parts of the oxide layers (undesirably covering the nitride layers 111), thereby exposing the nitride layers 111 as depicted in FIG. 6A.

In one embodiment, each of the air-gaps $G_{air}$ is completely encapsulated in each of the oxide layers 18, as shown in FIG. 6A. In FIG. 6A, the air-gaps $G_{air}$ are spaced apart from the adjacent nitride layers 111, and the air-gaps $G_{air}$ have spindle-shaped cross-section. In one embodiment, the spindle-shaped cross-section of an air-gap $G_{air}$ may have a short axis ax (vertical to the substrate 10) and a long axis $a_L$ (parallel to the substrate 10) intersecting to each other. Also, the air-gaps $G_{air}$ can be substantially formed in the centers of the oxide layers 18.

Figure 7:
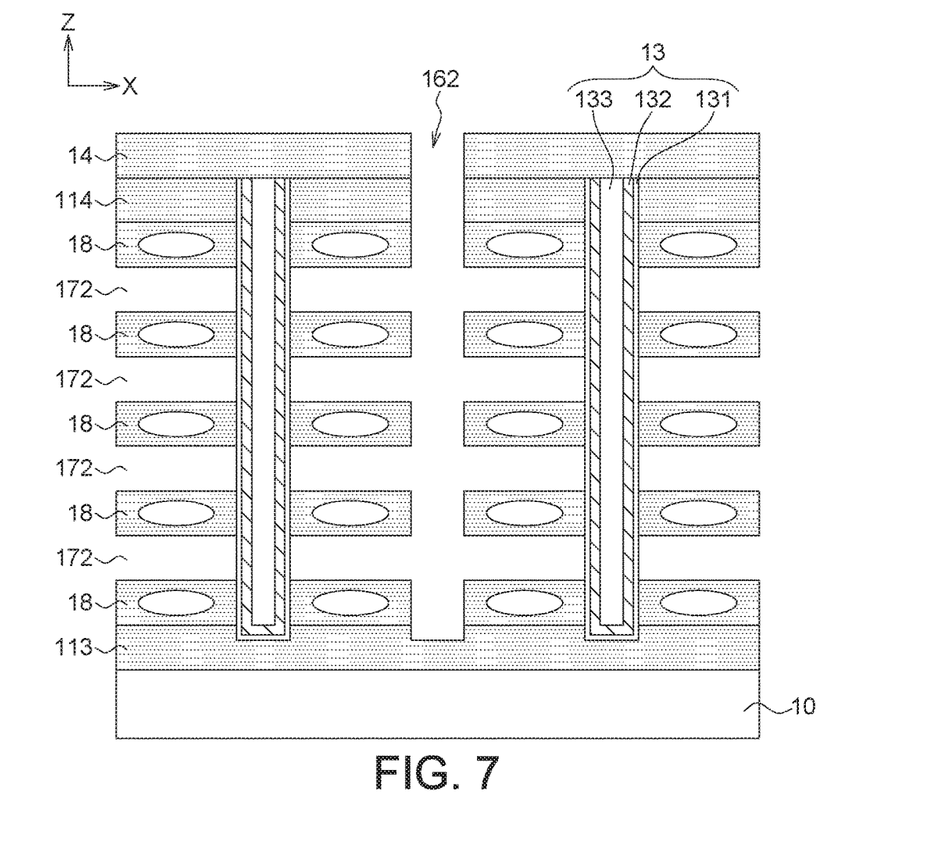

Afterwards, the nitride layers 111 are replaced with the conductive layers (ex: comprising metal layers) through the linear spaces of the line pattern 16. As shown in FIG. 7, removal of the nitride layers 111 is performed; for example, the nitride layers 111 are completely removed, such as by dipping the structure in a hot phosphoric ($H_3PO_4$) acidic solution, to form a plurality of second cavities 172, thereby exposing the channel holes 13 and the oxide layers 18.

Figure 8A:
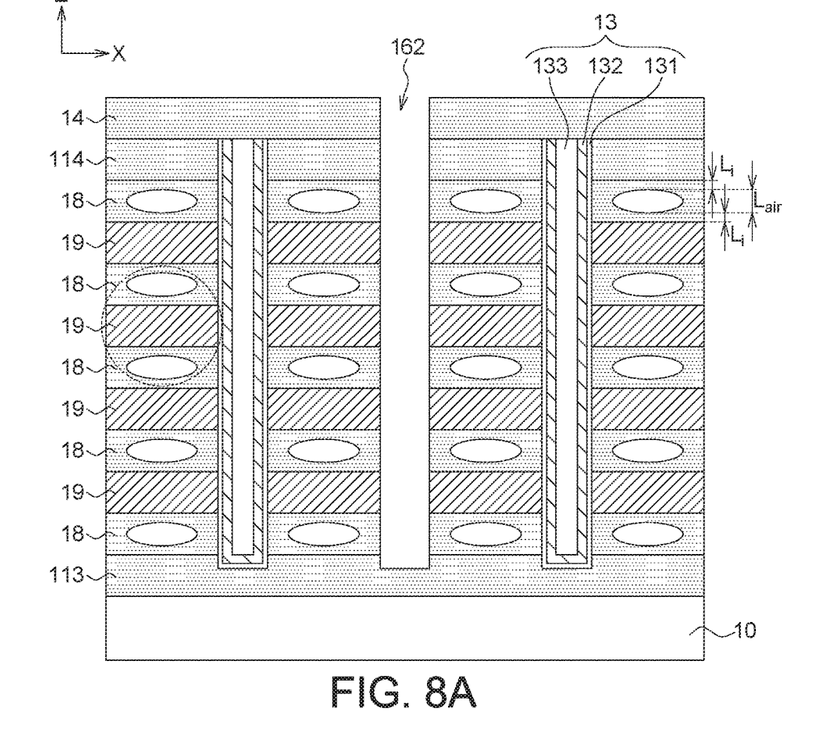

Then, as shown in FIG. 8A, several conductive layers 19 are formed in the second cavities 172 for replacing the nitride layers 111. Similarly, the conductive layers 19 are patterned by chemical dry etching (CDE) or wet etching (non-conformably etching) to pull back the sidewalls of the conductors, thereby preventing undesired connection (short circuit) between adjacent conductive layers 19. The conductive layers 19 function as WLs in VC type 3D semiconductor structure of the applications. Also, in FIG. 8A, the spindle-shaped cross-section of the air-gap $G_{air}$ may have a largest length $L_{air}$ vertical to the substrate 10 (i.e the largest length $L_{air}$ is parallel to the Z-direction), and the air-gap $G_{air}$ is spaced apart from adjacent two of the conductive layers 19 by a distance $L_i$. In one embodiment, the largest length $L_{air}$ is larger than the distance $L_i$; for example, a ratio of the largest length $L_{air}$ to the distance $L_i$ is equal to 2, or larger than 2. As shown in FIG. 8A, for an oxide layer 18, the lengths of the oxide material ($L_i$) and the air-gap $G_{air}$ ($L_{air}$) could be presented as: $L_i:L_{air}:L_i=$, 1:2:1.

Figure 8B:
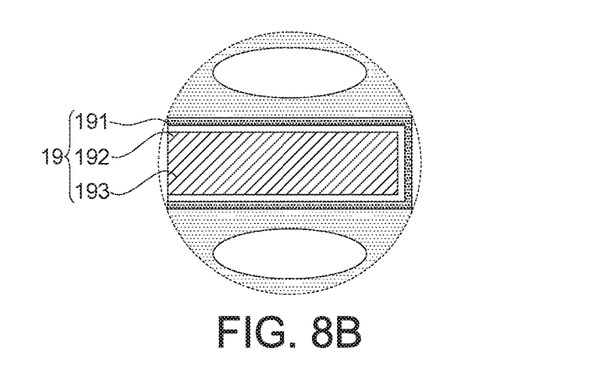

Additionally, each of the conductive layers 19 can be a multi-layered configuration. FIG. 8B is an enlarging view of a conductive layer 19 in one of the second cavities of FIG. 8A according to one embodiment of the disclosure. In one embodiment, the conductive layer 19 in the second cavity 172 may comprise a high-k dielectric liner film 191 (ex: AlOx or HfOx) deposited in the second cavity 172; a titanium nitride (TiN) layer 192 deposited along the high-k dielectric liner film 191 in the second cavity 172; and a tungsten (W) layer 193 deposited for filling up rest spaces in the second cavity 172. The tungsten (W) layers 193 of the conductive layers 19 reduce WL resistance.

According to the method and structures of the 3D semiconductor devices as illustrated in the embodiment above, a patterned multi-layered stack comprising the insulating layers (ex: oxide layers 18) having the air-gaps $G_{air}$ and the conductive layers (ex: the conductive layers 19) arranged alternately can be formed above a substrate 10 in an array area of a 3D stacked semiconductor structure. Since the array area of a 3D stacked semiconductor structure is a big area, the existence of the air-gaps $G_{air}$ reduces the weight of a 3D stacked semiconductor structure as manufactured, so that the configuration at the channel hole (ex: comprising the ONO layer and the poly channel layer) functioning as a supporting pillar can sustain more stacking layers during fabrication of a 3D stacked semiconductor structure. Additionally, the existence of the air-gaps $G_{air}$ decreases the capacitance between the conductive layers 19 (the dielectric constants of oxide and air are 3.9 and 1, respectively), thereby improving the electrical characteristics of the 3D stacked semiconductor structure in the application. Also, the method of the embodiment causes no damage to the related layers and components of the structure. The method of the embodiment is especially suitable for manufacturing the 3D stacked semiconductor structure with high and thin supporting pillars (ex: channel holes) or large number of the stacking layers, and the structure of the embodiments possesses a solid construction (due to the reduced weight of the insulating layers and less loading of the supporting pillar), a complete profile of the related layers and components, and reliable electrical characteristics. Furthermore, the 3D stacked semiconductor structure of the embodiment is manufactured by adopting no time-consuming and expensive procedures, which is suitable for mass production.

It is noted that the structures and methods as described above are provided for illustration. The disclosure is not limited to the configurations and procedures disclosed above. Other embodiments with different configurations of known elements can be applicable, and the exemplified structures could be adjusted and changed based on the actual needs of the practical applications. It is, of course, noted that the configurations of figures are depicted only for demonstration, not for limitation. Thus, it is known by people skilled in the art that the related elements and layers in the array area of a 3D stacked semiconductor structure, the shapes or positional relationship of the air-gaps, and the procedure details could be adjusted or changed according to the requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of manufacturing a three-dimensional (3D) stacked semiconductor structure, comprising:

forming a multi-layered stack above a substrate, and the multi-layered stack comprising a plurality of nitride layers and polysilicon layers arranged alternately;

forming a plurality of channel holes vertically to the substrate;

patterning the multi-layered stack to form linear spaces between the plurality of channel holes and vertical to the substrate, wherein the linear spaces extend downwardly to expose sidewalls of the plurality of nitride layers and the plurality of polysilicon layers;

replacing the plurality of polysilicon layers with insulating layers having air-gaps through the linear spaces; and replacing the plurality of nitride layers with conductive layers through the linear spaces.

2. The method according to claim 1, wherein the polysilicon layers are N+ polysilicon layers or P+ polysilicon layers.

3. The method according to claim 1, wherein a bottom oxide layer is formed on the substrate, the multi-layered stack is formed on the bottom oxide layer, and a top oxide layer is formed on the multi-layered stack.

4. The method according to claim 3, wherein the plurality of channel holes extend downwardly and stop on the bottom oxide layer.

5. The method according to claim 3, wherein the linear spaces extend downwardly to expose the bottom oxide layer.

6. The method according to claim 3, further comprising forming a cap oxide layer on the top oxide layer, wherein the cap oxide layer covers the plurality of channel holes, and patterning the multi-layered stack to form the linear spaces is performed after forming the cap oxide layer.

7. The method according to claim 1, wherein the plurality of polysilicon layers are removed by tetra-methyl ammonium hydroxide (TMAH) dipping.

8. The method according to claim 1, wherein replacing the plurality of polysilicon layers with the insulating layers comprises:

completely removing the plurality of polysilicon layers to form a plurality of first cavities; and depositing oxide layers in the plurality of first cavities as the insulating layers.

9. The method according to claim 8, wherein depositing the oxide layers comprises:

conformally depositing first oxide portions in the plurality of first cavities; and non-conformally depositing second oxide portions in the plurality of first cavities for forming the air-gaps.

10. The method according to claim 9, wherein each of the air-gaps is completely encapsulated in each of the oxide layers.

11. The method according to claim 1, wherein replacing the plurality of nitride layers with conductive layers comprises:

completely removing the plurality of nitride layers to form a plurality of second cavities;

depositing the conductive layers in the plurality of second cavities; and pulling back the conductive layers.

12. The method according to claim 11, wherein depositing the conductive layers in the plurality of second cavities comprises:

depositing a high-k dielectric liner film in the plurality of second cavities;

depositing a titanium nitride (TiN) layer along the high-k dielectric liner film in the plurality of second cavities; and deposition a tungsten (W) layer for filling up rest spaces in the plurality of second cavities.

13. A three-dimensional (3D) stacked semiconductor structure, comprising:

a substrate, having an array area and a peripheral area;

a patterned multi-layered stack formed above the substrate in the array area, and the patterned multi-layered stack comprising:

a plurality of insulating layers having air-gaps;

a plurality of conductive layers, wherein the plurality of insulating layers and the plurality of conductive layers are arranged alternately; and a plurality of channel holes vertically to the substrate and extending downwardly for penetrating the plurality of insulating layers and the plurality of conductive layers, wherein each of the plurality of channel holes comprises:

a charge trapping layer as a liner of the channel hole;

a polysilicon channel layer deposited along the charge trapping layer; and a dielectric medium layer filling up rest space inside the channel hole.

14. The 3D stacked semiconductor structure according to claim 13, wherein a bottom oxide layer is formed on the substrate, the patterned multi-layered stack is formed on the bottom oxide layer, and a top oxide layer is formed on the patterned multi-layered stack, wherein the plurality of channel holes stop on the bottom oxide layer.

15. The 3D stacked semiconductor structure according to claim 14, wherein a cap oxide layer is formed on the top oxide layer to cover the plurality of channel holes.

16. The 3D stacked semiconductor structure according to claim 13, wherein the plurality of insulating layers having the air-gaps are oxide layers having the air-gaps.

17. The 3D stacked semiconductor structure according to claim 16, wherein each of the oxide layers comprises:

a first oxide portion conformally deposited; and a second oxide portion non-conformally deposited along the first oxide portion for generating one of the air-gaps, wherein the one of the air-gaps is encapsulated by the first oxide portion and the second oxide portion.

18. The 3D stacked semiconductor structure according to claim 13, wherein each of the air-gaps of the plurality of insulating layers has a spindle-shaped cross-section.

19. The 3D stacked semiconductor structure according to claim 18, wherein the spindle-shaped cross-section of the air-gap has a largest length $L_{air}$ vertical to the substrate, the air-gap is spaced apart from adjacent two of the plurality of conductive layers by a distance $L_i$, wherein the largest length $L_{air}$ is larger than the distance $L_i$.

20. The 3D stacked semiconductor structure according to claim 19, wherein a ratio of the largest length $L_{air}$ to the distance $L_i$ is equal to or larger than 2.

* * * * *